United States Patent [19]
Sadigh-Behzadi

[11] Patent Number: 5,096,427
[45] Date of Patent: Mar. 17, 1992

[54] SOCKET AND HEADER ELECTRICAL CONNECTOR ASSEMBLY

[75] Inventor: Amir-Akbar Sadigh-Behzadi, Van Nuys, Calif.

[73] Assignee: Thomas & Betts Corporation, Bridgewater, N.J.

[21] Appl. No.: 648,244

[22] Filed: Jan. 31, 1991

[51] Int. Cl.⁵ .............................................. H01R 9/09
[52] U.S. Cl. ...................................... 439/76; 361/399
[58] Field of Search ............................ 439/76, 78; 361/393–395, 399; 174/52.2

[56] References Cited

U.S. PATENT DOCUMENTS

| | | | |
|---|---|---|---|
| 3,391,384 | 7/1968 | Hughes | 439/76 |
| 3,479,634 | 10/1968 | Ritulsky . | |
| 3,699,394 | 10/1972 | Schuler | 174/52.2 |
| 3,924,918 | 10/1975 | Friend . | |
| 4,070,081 | 1/1978 | Takahashi | 361/399 |
| 4,085,998 | 4/1978 | Owens . | |
| 4,542,260 | 9/1985 | Pearce | 174/52 |
| 4,582,375 | 4/1986 | Keller . | |
| 4,629,267 | 10/1986 | Stepan . | |
| 4,799,893 | 1/1989 | Ogawa | 439/81 |
| 4,857,002 | 8/1989 | Jensen et al. | 439/76 |
| 4,952,529 | 8/1990 | Grider | 439/78 |
| 5,000,701 | 3/1991 | Norden | 439/680 |

FOREIGN PATENT DOCUMENTS 3002515 7/1981 Fed. Rep. of Germany .
1-14996 1/1989 Japan ............................. 361/399

Primary Examiner—Neil Abrams
Attorney, Agent, or Firm—Robert M. Rodrick; Salvatore J. Abbruzzese

[57] ABSTRACT

A connector assembly for electrically connecting an electronic apparatus to a printed circuit board includes a matable socket connector and head connector. The socket connector includes a lower housing which supports the electronic apparatus and which is capable of containing an insulative curable potting compound. A plurality of electrical contacts is supported by the lower housing in electrical engagement with the electronic apparatus. A cover is supportable over the lower housing for enclosing the housing. The electronic apparatus is supported within the socket connector in position so that the curable potting compound may completely surround the electronic apparatus providing an environmental seal. The socket connector is insertable into the header connector supported on the printed circuit to establish electrical connection therebetween.

18 Claims, 3 Drawing Sheets

SOCKET AND HEADER ELECTRICAL CONNECTOR ASSEMBLY

FIELD OF THE INVENTION

The present invention relates to a connector assembly including an interconnectable socket connector and header connector. More particularly, the present invention relates to a connector assembly for electrically connecting an electronic apparatus housed in a socket connector to a header connector.

BACKGROUND OF THE INVENTION

In establishing electrical connection between various components, especially in the electronics environment, socketing has long been used as an expedient. Socketing entails providing a pair of connectors which are matable. One connector of the pair typically houses an electronic apparatus while the other connector of the pair is mounted and electrically secured to an object to which connection is desired such as a printed circuit board. Where connection is desired between an electronic apparatus and a printed circuit board, the first connector is usually referred to as a socket connector while the second connector is usually referred to as a header connector.

In addition to providing ease of interconnectability, the socket connector is also used to provide physical protection to the electronic apparatus housed therein. Socket connectors may be constructed which totally enclose an electronic apparatus housed therein to prevent external contaminants from adversely affecting the electrical performance of the apparatus. However, in certain extremely harsh environments, such as those found in the engine compartment of an automobile, merely covering the electronic apparatus may be insufficient protection.

The art has seen the use of encapsulation techniques where the electronic apparatus is encapsulated or potted, with a curable potting compound. The potting compound is typically provided in a fluid state, which after being poured around the electronic apparatus, hardens or cures to a solid state, thereby providing an environmental seal around the electronic apparatus. Socket connectors, which support such electronic apparatus, must be also capable of containing a curable potting compound in such a manner that complete encapsulation of the electronic apparatus is achieved.

In order to facilitate mass production of such socketed connectors, the socket connector should support the electronic apparatus in such a manner that it is relatively easy to completely encapsulate with potting material.

SUMMARY OF THE INVENTION

It is an object of the present invention to provide a connector assembly for electrically connecting an electronic apparatus to a printed circuit board.

It is a further object of the present invention to provide a socketable connector assembly which permits the matable interconnection of electronic components.

It is a still further object of the present invention to provide a connector assembly for electrically connecting an electronic apparatus supported in a socket connector to a header connector supported on a printed circuit board, and which permits the encapsulation of the electronic apparatus supported in the socket connector.

In the efficient attainment of these and other objects, the present invention provides a connector assembly for electrically connecting an electronic apparatus to a printed circuit board. The assembly includes a socket connector and a matable header connector. The socket connector includes an insulative open-sided container which is capable of retaining a curable potting compound. A plurality of electrical contacts are supported by the container having first ends within the container which engage and support the electronic apparatus. Opposed second ends of the contacts extend exteriorly of the connector. Means is provided for supporting the electronic apparatus in a position within the container to permit the electronic apparatus and the first ends of the contacts to be surrounded by the potting compound. A cover is supportable over the container to enclose the potted electronic apparatus. The header connector is securable to the printed circuit board and includes an insulative housing and plural electrical terminals electrically engageable with the socket contacts to establish electrical connection therebetween.

As more particularly shown by way of the preferred embodiment, the socket connector includes an open-sided container having a bottom wall and an upstanding side wall extending around the perimeter of the bottom wall. A support platform extends from the bottom wall of the container to support the electronic apparatus in a position spaced from the bottom wall to permit the potting compound to flow therearound. The first ends of the contacts in the socket connector are positioned at a location spaced from the bottom wall and the side wall to help support the electronic apparatus in a position where the potting compound can easily flow therearound.

DETAILED DESCRIPTION OF THE PREFERRED EMBODIMENTS

Figure 1:
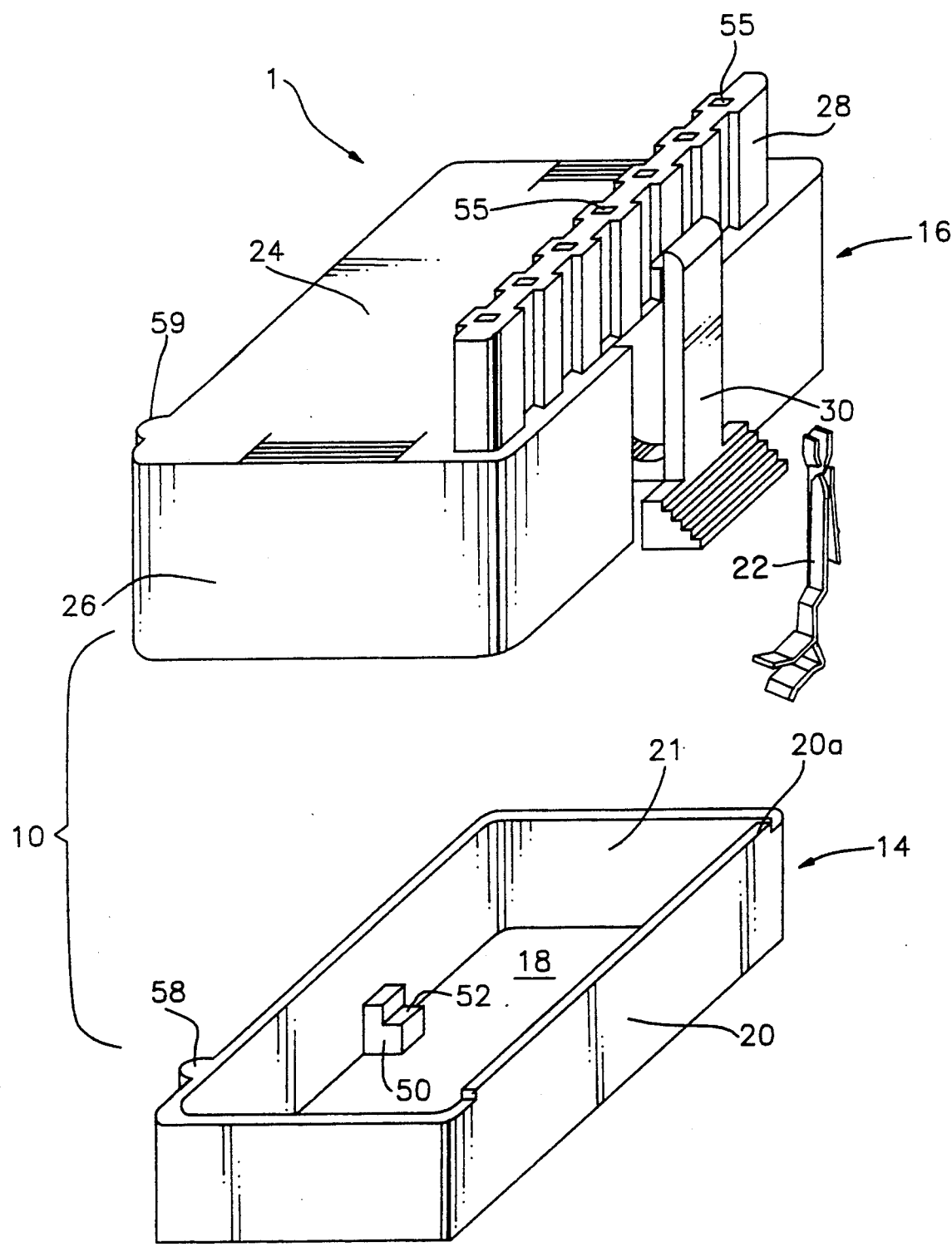
FIG. 1 shows in exploded perspective view, the socket connector of the connector assembly of the present invention.
Figure 2:
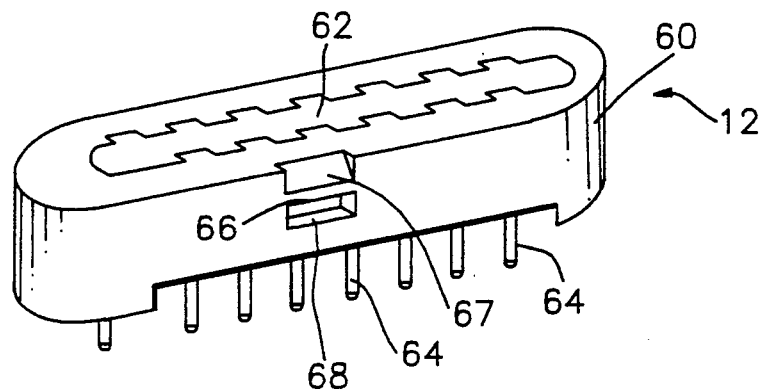
FIG. 2 is a perspective showing of a header connector of the connector assembly of the present invention.

The electrical connector assembly 1 of the present invention is shown in FIGS. 1 and 2. Connector assembly 1 includes a socket connector 10 shown in FIG. 1 and an intermediate header connector 12 shown in FIG. 2. Socket connector 10 is formed of a suitable electrically insulative plastic material and as shown in FIG. 1 includes a lower housing 14 and an upper cover 16. Lower housing 14 is generally rectangular in shape having a planar bottom wall 18 and an upstanding side wall 20 extending about the perimeter of bottom wall 18. The upper surface of lower housing 14 is open thereby forming an open-ended container which is closed by cover 16. Lower housing 14 and side wall 20 define and internal cavity 21.

Socket connector 10 further includes plural electrical contacts 22, one of which is shown in FIG. 1. Contacts 22 are positioned on lower housing 14 in a manner which will be described in further detail hereinbelow.

Cover 16 is also generally rectangular in shape, having a planar upper wall 24 and a depending side wall 26 extending perimetrically around upper wall 24. Cover 16 is constructed to fit over lower housing 14 to enclose cavity 21 thereof. Cover 16 includes an upwardly extending portion 28, which permits accommodation of contacts 22 as will be described in further detail hereinbelow. Cover 16 also includes a latch 30 mounted on side wall 20. Latch 30 is manually operable to secure and lock socket connector 10 to header connector 12, as will be described in further detail hereinbelow.

Figure 3:
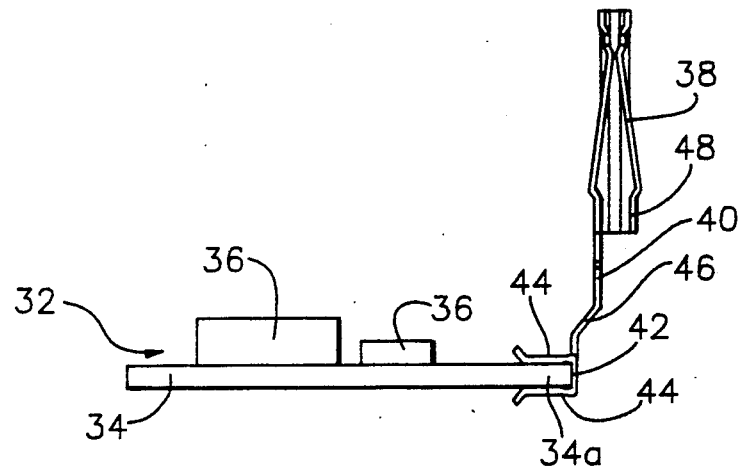
FIG. 3 shows an electrical contact used in the socket connector shown in FIG. 1, attached to an electronic apparatus.

Referring additionally to FIG. 3, socket connector 10 is designed to house an electronic apparatus 32 which may include a printed circuit board 34 upon which are mounted various electronic devices 36. Electrical contacts 22 are used to establish electrical connection with electronic apparatus 32. Contacts 22 are elongate members formed of suitably electrically conductive material, and include a first end conventionally formed into a pin receiving socket 38. Each contact 22 further includes an elongate central portion 40 extending from socket 38 to a connecting clip element 42 at the opposite end thereof. Clip element 42 is used to engage an edge 34a of printed circuit board 34. Clip element 42 includes upper and lower fingers 44 which engage opposed surfaces of printed circuit board 34 about edge 34a. Fingers 44 typically electrically engage metallic traces (not shown) on the surfaces of printed circuit board 34 to establish electrical connection therebetween. Central portion 40 of contact 22 includes an angled transition region 46 which horizontally spaces clip element 42 from socket 38.

In the present embodiment, it is contemplated that socket connector 10 will employ eight electrical contacts 22. The contacts 22 are spaced along edge 34a of printed circuit board 34. The clip elements 42 of contacts 22 secure contacts 22, both mechanically and electrically to printed circuit board 34. It of course may be appreciated that a socket connector may be constructed which could support a various number of contacts 22 as may be needed for a particular application.

Figure 4:
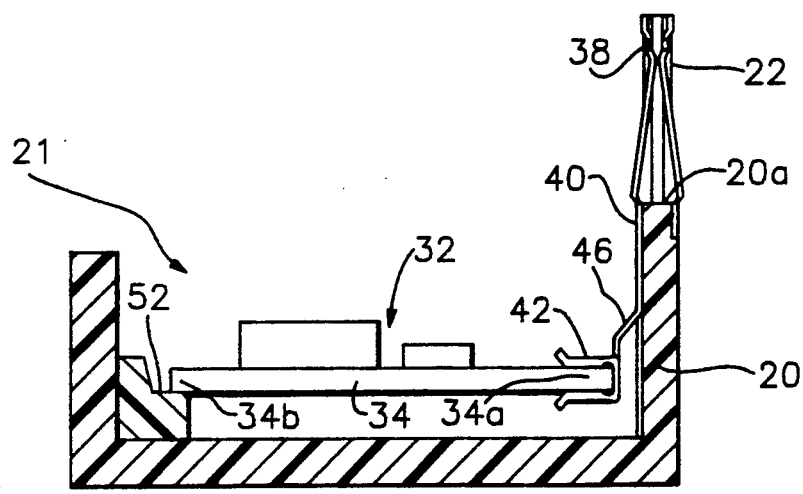
FIG. 4 shows the socket contact and the electrical apparatus shown in FIG. 2, supported by a housing of the socket connector of FIG. 1.

Referring now to FIG. 4, the electronic apparatus 32 and contacts 22 which are secured thereto, are inserted into lower housing 14. Socket contact 22 includes a wall engaging portion 48, shown in FIG. 3, which clips onto an upper edge of 20a of side wall 20. The engagement of each of contacts 22 with the upper edge 20a of side wall 20 secures the contacts thereto and also fixably supports electronic apparatus 32 within cavity 21 of lower housing 14.

Contacts 22 are constructed so that central portion 40 thereof extends down toward bottom wall 18, but terminates in clip element 42 at a location spaced from bottom wall 18. Thus, as shown in FIG. 4, clearance is provided between printed circuit board 34 and bottom wall 18. Additionally, as shown in FIGS. 1 and 4, lower housing 14 includes a platform 50 extending upwardly from bottom wall 18 at a location spaced from contacts 22. Platform 50 includes a board bearing surface 52, which is substantially parallel to bottom wall 18 and which supports an edge 34b of printed circuit board 34 opposite to edge 34a. Platform 50 helps support printed circuit board 34 within cavity 21 at a location spaced from bottom wall 18. In addition, as particularly shown in FIG. 4, transition region 46 of contact 22 disposes clip element 42 at a location spaced inwardly from side wall 20. This provides a clearance between clip element 42 and side wall 20. Further, board bearing surface 52 of platform 50 is spaced inwardly from side wall 20. Thus, as positioned in FIG. 4, printed circuit board 34 is positioned centrally within cavity 21 spaced from side walls 20. By spacing printed circuit board 34 away from both bottom wall 18 and side all 20 of lower housing 14, clearance is provided on all sides of printed circuit board 34 which permits complete encapsulation of electric apparatus 32.

Figures 5, 6:
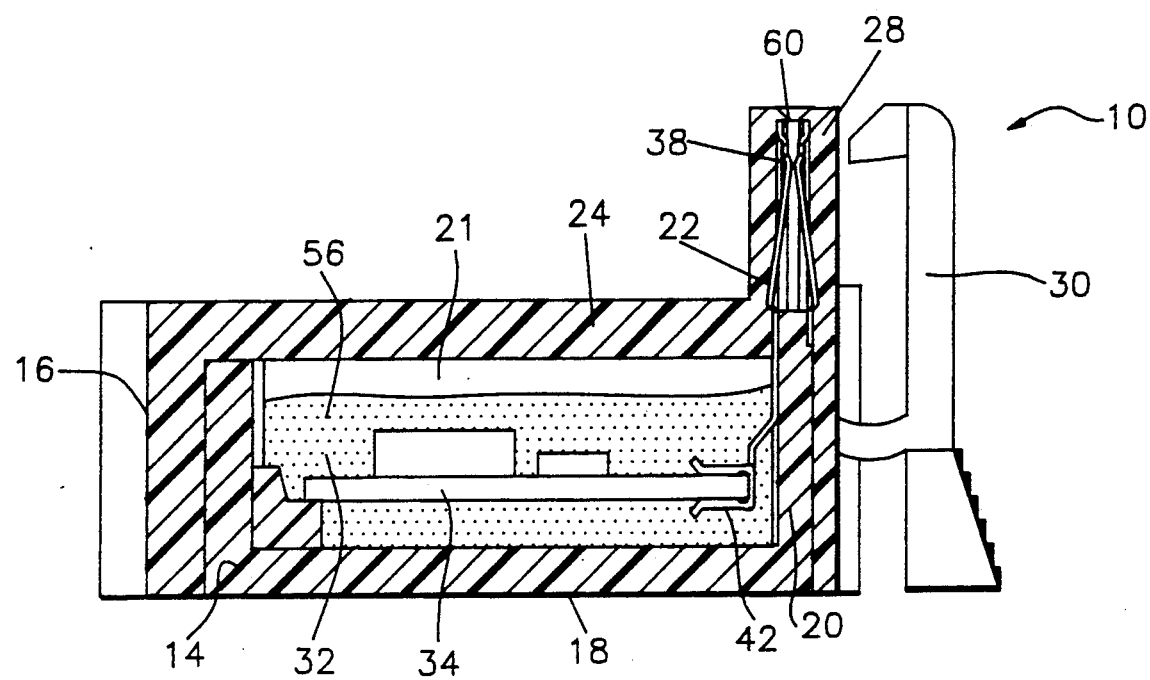
FIG. 5 shows partially in section, the assembled socket connector of FIG. 1.
FIG. 6 shows partially in section, the assembled socket connector of FIG. 5 inverted and connected to the header connector shown in FIG. 2.

Referring now to FIG. 5, an electronic apparatus 32, including printed circuit board 34, is spaced both vertically and horizontally away from bottom wall 18 and side wall 20 of lower housing 14, a potting compound 56 may be poured into cavity 21 of lower housing 14 to completely surround electronic apparatus 32 as well as clip elements 42 of contacts 22 which engage printed circuit board 34. Potting compound 56 is of the type which is commonly used and commercially available in the electronics industry to environmentally seal electronic components. It is typically provided in a fluid state so that it may be poured into cavity 21 of lower housing 14, to flow completely around electronic apparatus 32 and clip elements 42 of contacts 22. The potting compound 56 is permitted to cure to a hardened state whereby the electronic apparatus as well as its electrical connection to contacts 22, are environmentally sealed.

Once potting compound 56 hardens or cures, cover 16 may be placed over lower housing 14 to enclose the potted electronic apparatus 32. As shown in FIG. 1, lower housing 14 and cover 16 may include cooperative key element such as a rib 58 on lower housing 14 and a slot 59 on cover 16 to provide keyed-matability between cover 16 and lower housing 14. Extending portion 28 of cover 16 accommodates extending sockets 38 of contacts 22, securely retaining contacts 22 within socket connector 10. Extending portion 28 includes openings 55 adjacent sockets 38 to permit electrical connection to sockets 38.

Referring now to FIGS. 2 and 6, the connection of socket connector 10 to header connector 12 is shown. Header connector 12 includes an elongate insulative body 60, having a central cavity 62 of like shape to that of extending portion 28 of cover 16 which is received therein. The shape of extending portion 28 and cavity 62 provides a keying feature preventing improper connection of socket connection 10 to header contacts 12. Header connector 12 includes a plurality of pin-type contact terminals 64 in number corresponding to the number of contacts 22 in socket connector 10. Header connector 12 includes a latch receiving member 66, which comprises a tapered lead-in portion 67 and a securement portion 68. Latch receiving member 66 is engageable with latch 30 to lock socket connector 10 to header connector 12.

As shown in FIG. 6, header connector 12 is typically mounted to a further printed circuit board 65 in conventional fashion. Socket connector 10 is inverted from its position shown in FIG. 5, so that it may be connected to header connector 12 mounted on printed circuit board 65. Extending portion 28 of cover 16 supporting contacts 22 is inserted into cavity 62 of header connector 12. Electrical connection is established between terminal 64 and socket 38 of each of contacts 22 in conventional pin and socket fashion. Latch 30 engages lead-in portion 67 and snaps into securement portion 68 to lock socket connector 10 to header connector 12. Latch 30 may be manually released so that socket connector 10 may be removed from header connector 12.

Socket connector 10 provides an environmental seal to electronic apparatus 32, and therefore may be used in harsh environments such as the engine compartment of an automobile to establish electrical connection between sophisticated electronic components now being used in automobiles.

Various changes to the foregoing described and shown structures would now be evident to those skilled in the art. Accordingly, the particularly disclosed scope of the invention is set forth in the following claims.

I claim:

1. A connector assembly for electrically connecting an electronic apparatus to a printed circuit board, comprising:
    a socket connector including:
    an insulative open-sided container being defined by at least one cavity wall for containing an electrically insulative curable potting compound;
    a plurality of elongate electrical contacts supported by said container, each having a first end positioned within said contained and spaced from said one cavity wall and electrically engagable with said electronic apparatus at a position with said container and an opposed second end extending exteriorly of said container;
    means inclusive of said contact first ends for supporting said electronic apparatus in a position to permit said electronic apparatus and said first ends of said contacts to be surrounded by said potting compound; and
    a cover supportable over and enclosing said container, said cover having an extending portion supporting said exteriorly extending second ends of said contacts; and
    a header connector for securement to said printed circuit board including:
    a plurality of elongate electrical terminals each having a board connecting end an opposed contact connecting end; and
    an insulative housing supporting said terminals, said housing having a central cavity for receipt of said extending portion of said cover for placing said contact connecting ends of said terminals in electrical connection with said second ends of said contacts.

2. A connector assembly of claim 1 further including latching means for mechanically securing said socket connector to said header connector.

3. A connector assembly of claim 2 wherein said latching means includes a latch member supported by said cover, said latch member being manually operable between a latched and unlatched position; and
    a latch engaging element on said header for engaging said latch in said latched position.

4. A connector assembly of claim 1 wherein said socket connector and said header connector include cooperative keying members for permitting keyed-connection of said socket connector and header connector.

5. A connector assembly of claim 1 wherein each of said contact connecting ends of said electrical terminals is pin-shaped.

6. A connector assembly of claim 5 wherein said second ends of said electrical contacts are sockets which are adapted to receive said pin-shaped contact connecting ends of said terminals.

7. A connector assembly of claim 6 wherein said electronic apparatus includes an elongate apparatus printed circuit board.

8. A connector assembly of claim 7 wherein said first ends of said contacts include a clip-element for mechanically and electrically engaging said apparatus printed circuit board.

9. A connector assembly of claim 1 wherein said open-sided container includes a planar surface and an upstanding side wall extending from the perimeter of said planar surface.

10. A connector assembly of claim 9 wherein said supporting means includes a platform extending from said planar surface, said platform having a support surface spaced from said planar surface for supporting a portion of said electronic apparatus.

11. A connector assembly of claim 9 wherein said first ends of said contacts are spaced inwardly of said side wall.

12. A connector assembly of claim 9 wherein said first ends of said contacts are spaced from said planar surface.

13. An electrical socket connector for connecting an electronic apparatus to a header connector, comprising:
    an insulative connector housing having an exteriorly-opening cavity capable of receiving and containing a curable potting compound said housing including a planar surface and an upstanding side wall bounding said planar surface;
    plural elongate electrical contacts fixedly supported by said side wall of said housing having first end portions extending within said cavity spaced from said side wall for engagement with said electronic apparatus within said housing and second end portions extending exteriorly of said housing;
    means for supporting said electronic apparatus within said cavity in a position permitting said curable potting compound to surround said electronic apparatus and first end portions of said contacts; and
    a cover enclosing said cavity and supporting said extending second end portions of said contacts in position for connection to said header connector.

14. A socket connector of claim 13 wherein said supporting means includes each said contact first end portion having a clip member for supporting said electronic apparatus in said cavity spaced from said planar surface.

15. A socket connector of claim 14 wherein each said clip member includes an engagement portion for establishing electrical connection with said electronic apparatus.

16. A socket connector of claim 13 wherein each of said contacts includes an elongate central portion extending between said first and second end portions.

17. A socket connector of claim 16 wherein said contact central portion includes an elongate first extent adjacent said first end portion which extends along said side wall and a second extent adjacent said second end portion spaced from said side wall.

18. A socket connector of claim 17 wherein each said clip member is spaced from said side wall.

* * * * *